United States Patent
Bonnell et al.

(10) Patent No.: US 6,982,174 B2
(45) Date of Patent: Jan. 3, 2006

(54) DIRECTED ASSEMBLY OF NANOMETER-SCALE MOLECULAR DEVICES

(75) Inventors: Dawn A. Bonnell, West Chester, PA (US); Rodolfo Antonio Alvarez, Philadelphia, PA (US); Sergei V. Kalinin, Knoxville, TN (US)

(73) Assignee: The Trustees of the University of Pennsylvania, Philadelphia, PA (US)

( * ) Notice: Subject to any disclaimer, the term of this patent is extended or adjusted under 35 U.S.C. 154(b) by 127 days.

(21) Appl. No.: 10/344,810

(22) PCT Filed: Aug. 15, 2001

(86) PCT No.: PCT/US01/41726

§ 371 (c)(1),
(2), (4) Date: Sep. 3, 2003

(87) PCT Pub. No.: WO02/15240

PCT Pub. Date: Feb. 21, 2002

(65) Prior Publication Data

US 2004/0029297 A1  Feb. 12, 2004

Related U.S. Application Data

(60) Provisional application No. 60/225,261, filed on Aug. 15, 2000.

(51) Int. Cl.
 H01L 21/00   (2006.01)
 H05K 3/00   (2006.01)

(52) U.S. Cl. .............................. 438/3; 438/677; 29/829; 977/DIG. 1

(58) Field of Classification Search ............ 977/DIG. 1; 438/3, 800, 674, 676, 677, DIG. 974; 257/414, 257/618; 29/825, 829
See application file for complete search history.

(56) References Cited

U.S. PATENT DOCUMENTS

| | | | |
|---|---|---|---|
| 5,517,280 A | | 5/1996 | Quate |
| 5,606,190 A | * | 2/1997 | Hofmann et al. ........... 257/316 |
| 5,756,263 A | * | 5/1998 | Gupta et al. ................. 430/317 |
| 6,000,947 A | | 12/1999 | Minne et al. |
| 6,262,426 B1 | | 7/2001 | Zafiratos |

OTHER PUBLICATIONS

Author unknown, "Nano Patterning Surfaces with Electric Charge", PennTechnology News, University of Pennsylvania, vol. 7, Jun. 2000, entire article.

Whatmore, R.W., "Ferroelectrics, Microsystems and Nanotechnology", IEEE Colloquium on Electrotechnical Ceramics—Processing, Properties and Applications, Nov. 14, 1997, p. 1 of 1.

Ahn, C.H. et al.,"Local, Nonvolatile Electronic Writing of Epitaxial Pb(Zr0.52Ti0.48)O3/SrRuO3 Heterostructures", Science, vol. 276: p. 1100–1103 (1997).

Chen, J., et al., "Large On–Off Ratios and Negative Differential Resistance in a Molecular Electronic Device", Science, vol. 286: p. 1550–52 (1999).

Kramer, N., et al., "Fabrication of metallic nanowires with a scanning tunneling microscope", Appl. Phys. Lett. 66 (11): p. 1325–1327 (1995).

(Continued)

*Primary Examiner*—Evan Pert
(74) *Attorney, Agent, or Firm*—Woodcock Washburn, LLP

(57) ABSTRACT

A ferroelectric substrate (10) is patterned using local electric fields from an apparatus (14) to produce nanometer sized domains with controlled surface charge (12), that allow site selective metalization (22) and subsequent reaction with functional molecules (18), resulting in nanometer-scale molecular devices.

57 Claims, 4 Drawing Sheets

OTHER PUBLICATIONS

Allen, T., et al., "Beyond Silicon: The Future of Computing", Technology Review, May/Jun., 29 pages enclosed (2000).

Pages from IAP/TU Wien STM Gallery and IBM STM Gallery, "The Scanning Tunneling Microscope—What it is and how it works . . . ", 5 pages enclosed, website last updated on May 22, 1997.

Fowler, T., "It's an extraordinarily small world, after all", The Philadelphia Inquirer, Thursday, Aug. 24, 2000.

Dagani, R., "Building from the Bottom Up", Chemical and Engineering News, vol. 78: p. 27, 28, 29 and 32, Oct. 16, 2000.

*IEEE Standard Dictionary of Electrical and Electronics Terms*, Fourth Edition, pp. 364–365.

Revised by Hawley, G.G., *The Condensed Chemical Dictionary*, Eighth Edition, Van Nostrand Reinhold Company, New York, p. 385.

Davis, J.R., Editor, Davis and Associates, *ASM Materials Engineering Dictionary*, ASM International, The Materials Information Society, p. 157.

Muralt, P., A. Kholkin, M. Kohli, T. Maeder, "Piezoelectric actuation of PZT thin–film diaphragms at static and resonant conditions", *Sensors and Actuators A*, vol. 53: p. 398–404 (1996).

Bernstein, J., et al., "Micromachined High Frequency Ferroelectric Sonar Transducers", *IEEE Trans. Ultrasonics, Ferroelectrics and Frequency Control*, vol. 44: p. 960–969, (1997).

Kalinin, S.V., and D.A. Bonnell, "Dynamic Behavior of Domain–Related Topography and Surface Potential on the $BaTiO_3$ (100) Surface by Varible Temperature Scanning Surface Potential Microscopy", *Z. Metallkund.*, vol. 90: p. 983 (3 pages enclosed) (1999).

Henrich, V., and A. Cox, *The Surface of Oxides*, Cambridge University Press (1994).

Bonnell, D.A., "Scanning Tunneling Microscopy and Spectroscopy of Oxide Surfaces" *Progress in Surface Science*, vol. 57: p. 187–252 (1998).

Page, C.C., C.C. Moser, X. Chen, P.L. Dutton, "Natural engineering principles of electron tunnelling in biological oxidation–reduction", *Nature*, vol 402: p. 47–52 (1999).

Pilloud, D., C. Moser, K. Reddy, P.L. Dutton, "Surface–Promoted Thioether Linkage between Proto– or Hemato porphyrins and Thiol–Silanized Quartz: Formation of Self–Assembled Monolayers and Interaction with Imidazole and Carbon Monoxide", *Langmuir*, vol. 14: p. 4809–18 (1998).

Gruverman, A., et al., "Scanning force microscopy for the study of domain structure in ferroelectric thin films", J. Vac. Sci. Technol. B 14(2): 602–605 (1996).

Gruverman, A., et al., "Polarization retention in $SrBi_2Ta_2O_9$ thin films investigated at nanoscale", J. Of Applied Physics, vol. 89: 1836–1843, (2001).

Bai, F., et al., "Polarization switching in (001)–oriented $Pb(Mg_{1/3}Nb_{2/3})O_3-x\%PbTiO_3$ crystals: Direct observation of heterogeneous nucleation by piezoreponse force microscopy", Applied Physics Letters, vol 85: p. 4457–4459, (2004).

Lin, A., et al., "Epitaxial growth of $Pb(Zr_{0.2}Ti_{0.6})O_3$ on Si and its nanoscale piezoelectric properties", Applied Physics Letters, vol. 78:2034–2036 (2001).

Tybell, T., et al., "Ferroelectricity in thin perovskite films", Applied Physics Letters, vol 75: 856–858 (1999).

Tybell, T., et al., "Control and imaging of ferroelectric domains over large areas with nanometer resolution in atomically smooth epitixial $Pb(Zr_{0.2}Ti_{0.6})O_3$ thin films", Applied Physics Letters, vol. 72: 1454–1456 (1998).

Kalinin, S.V. and D.A. Bonnell, "Temperature dependence of polarization and charge dynamics on the $BaTiO_3(100)$ surface bny scanning probe microscopy", Applied Physics Letters, vol. 78: 1116–1118 (2001).

Kalinin, S.V., et al., "Domain polarity and temperature induced potential inversion on the $BaTiO_3(100)$ surface", J. Of Applied Physics, vol 91: p. 3816–3823 (2002).

Kalinin, S.V., and D.A. Bonnell, "Effect of phase transition on the surface potential of the $BaTiO_3(100)$ surface by variable temperature scanning surface potential microscopy", J. Of Applied Physics, vol 87: p. 3950–3957 (2000).

Spitler, M.T., et al., "Electron transfer at sensitized $TiO_2$ electrodes", J. Chemical Physics, vol 66:4297–4305, (1977).

Rajeshwar, K., et al., "Cathodic photoprocesses on titania films and in aqueous suspensions", J. Of Electroanalytical Chemistry, vol. 538–539, p. 173–182 (2002).

Kalininin, S.V., et al., "Ferroelectric Lithography of Multicomponent Nanostructures", Adv. Mater. 16: 795–799 (2004).

Polla, et al., "Ferroelectric Thin Films in Microelectromechanical Systems Applications", MRS Bulletin, vol. 21: 59–65, (1996).

Giocondi, J.L., et al., "Spatially Selective Photochemical Reduction of Silver on the Surface of Ferroelectric Barlum Titanate", Chem. Mater. 13:241–242 (2001).

Hotsenpiller, P.A.M., et al., "Orientation Dependence of Photochemical Reactions on $TiO_2$ Surfaces", J. Phys. Chem. B, 102:3216–3226 (1998).

* cited by examiner

3(a)  3(b)

3(c)  3(d)

4(a)

4(b)

4(c)

4(d)

DIRECTED ASSEMBLY OF NANOMETER-SCALE MOLECULAR DEVICES

RELATED APPLICATIONS

This application is a National Stage of International Application No. PCT/US01/41726, filed Aug. 15, 2001, which claims the benefit of U.S. Provisional Application No. 60/225,261, filed on Aug. 15, 2000.

FIELD OF THE INVENTION

The present invention relates to nanometer-scale molecular devices and their fabrication, and in particular to devices and fabrication methods that enable molecular elements to be selectively positioned in complex arrangements to function as components such as electrical circuits, optical elements, or chemical sensors.

BACKGROUND OF THE INVENTION

It has been widely forecast that fabrication technology for computer chips will reach its limits in about a decade. The dramatic impact that this will have on almost every aspect of technological advance has motivated massive research efforts in industry, academia, and national laboratories to develop the replacement or extension strategy. The objective is to be able to make nanometer sized circuit elements, assemble them into complex circuits, integrate them with current semiconductor device technology, and maintain costs within acceptable limits. To this end, individual nanometer sized elements have been synthesized and shown to be electrically active. These include carbon nanotubes, oxide nanotubes, synthetic proteins and polypeptides, organic molecules, and the like. Present assembly proposals utilize chemical interactions and self-organization of molecules. Likewise, in optical fields the need for miniaturization requires the ability to fabricate optical devices having structures designed and built on the nanometer scale. The advantages afforded by such devices are already established theoretically, and it remains a challenge to create such devices with the beneficial properties predicted. A notable example of a pressing need for these materials is the data storage arena.

A formidable technical problem which remains unsolved is to devise a way to successfully position various different elements in a directed manner so as to produce devices, connect them to other components, such as electrodes, and integrate them into conventional systems. Important advances have been made using new lithographic techniques based on chemically controlled self assembly, microcontact printing, and self assembly in semiconductor film growth. Insofar as is known, however, it is not feasible to position individual nanometer sized device elements using these previously proposed approaches.

SUMMARY OF THE INVENTION

In accordance with the present invention, there is provided a method for directing assembly of a nanometer-scale (nanoscale) molecular device. The method is carried out using a substrate of ferroelectric material that has a first polarization distribution, which distribution may have a generally ordered polarization distribution or may have a substantially random polarization distribution. At least one localized region, having a second polarization distribution which is oriented differently relative to the first polarization distribution, is established on the ferroelectric substrate, under the influence of an energy field, such as an electric field, for example, applied to such region. Then, the substrate is exposed to ions of an electrically conductive metal, which ions are deposited selectively at the localized region(s), due to charge interaction between the metal ions and the charge of the localized region(s). The metal ions are converted in the process to elemental metal, to yield a metal-patterned substrate for use in a nanoscale molecular device. Thereafter, at least one functional molecule is chemically bound to the elemental metal and any unbound functional molecule is removed from the substrate, to yield the nanoscale molecular device.

The method of the invention affords a new approach to nano-fabrication of molecular devices, in which molecules capable of functioning as individual device components are controllably assembled to form circuits, optical systems, chemical sensors, and the like. A device so formed includes a substrate of ferroelectric material having at least one localized region at which the polarization is oriented to a pre-determined orientation. At least one metal is disposed at the localized region of the device, and at least one functional molecule is bound to the metal.

The nature of the method is such that it retains the advantages of stamping over scanning probe microscope (SPM)-based lithography to provide devices having dimensions on the nanometer scale. The advantages of the method and devices made therefrom will be evident from the following detailed description.

BRIEF DESCRIPTION OF THE DRAWINGS

The foregoing summary and the following detailed description of the preferred embodiments of the present invention will be best understood when read in conjunction with the appended drawings, in which.

Figure 1:
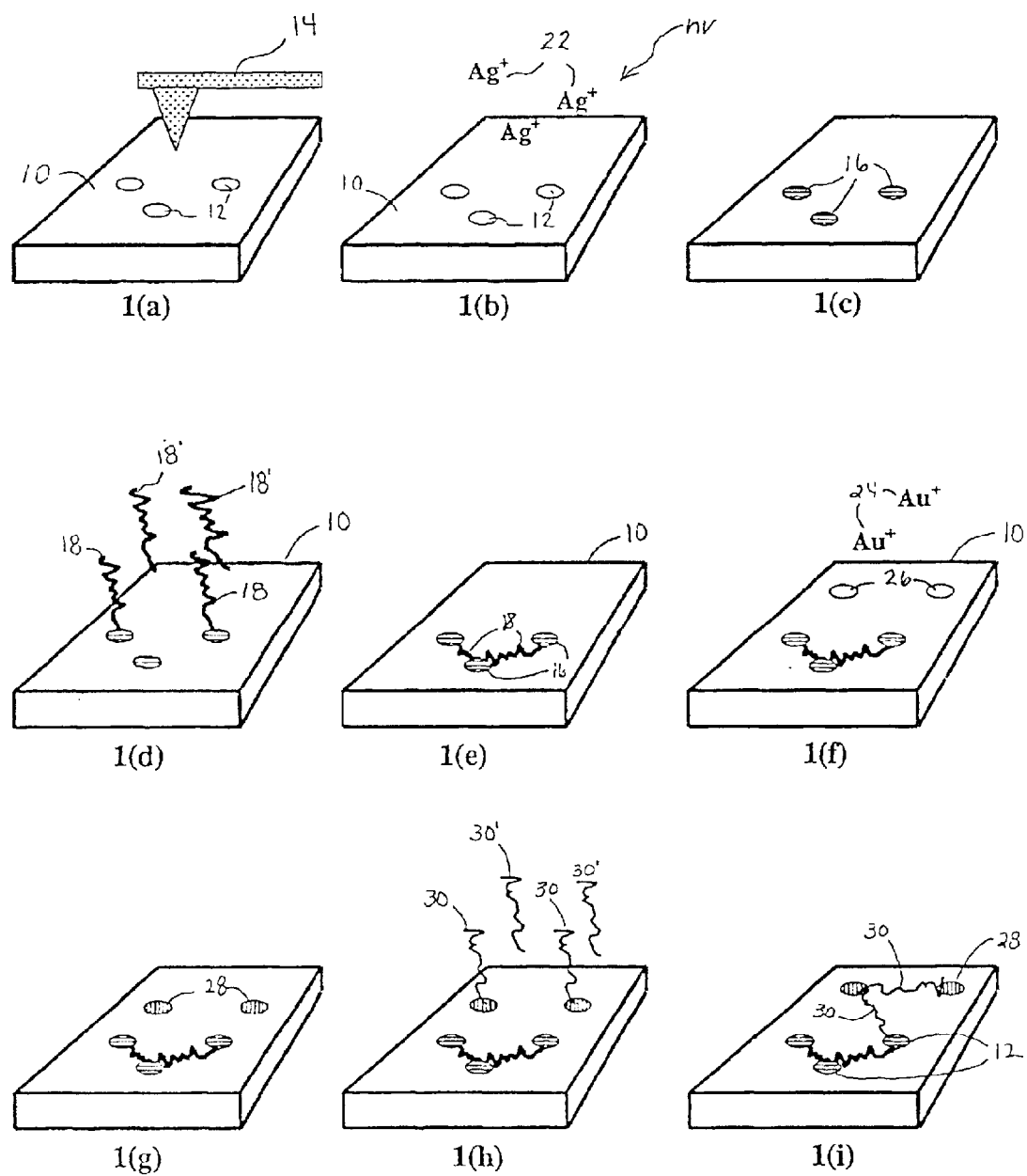
FIG. 1 is a schematic illustration of the method and device of the invention, the details of which are set forth in the description that follows.

The photomicrographs of FIGS. 2(a) and 2(d) show the surface topography and polarization distribution, respectively, of a substrate prior to −10 V switching;

The photomicrographs of FIGS. 2(b) and 2(e) show the surface topography and polarization distribution, respectively, of the substrate of FIG. 2(a) after −10 V switching;

The photomicrographs of FIGS. 2(c) and 2(f) show the surface topography and polarization distribution, respectively, of a substrate after −10 V switching;

FIGS. 3(a)–3(d) are photomicrographs showing the surface topography, polarization distribution, and deposition pattern for silver and palladium on a $BaTiO_3$ substrate surface;

The photomicrograph of FIG. 3(a) shows the surface topography of the substrate prior to metal deposition;

The photomicrograph of FIG. 3(b) shows the polarization distribution of the substrate prior to metal deposition;

The photomicrograph of FIG. 3(c) shows the surface topography of the substrate after silver deposition on the surface;

The photomicrograph of FIG. 3(d) shows the surface topography of the substrate after palladium deposition on the surface;

FIGS. 4(a)–4(d) are photomicrographs showing a $BaTiO_3$ substrate surface before and after silver deposition;

The photomicrographs of FIGS. 4(a) and (b) show the surface topography of the substrate before and after silver deposition, respectively; and The photomicrographs of FIGS. 4(c) and 4(d) show the substrate surface polarization distribution before and after switching, respectively.

DETAILED DESCRIPTION OF THE INVENTION

The method of this invention involves a series of steps that allow individual metal electrodes of nanometer size to be selectively patterned on a substrate and subsequent site selective reactions to chemically attach functional molecules to those electrodes.

As used herein the expression "functional molecules" refers to any molecule which is capable of functioning as an electronic, optical, or magnetic component and which, when controllably assembled in accordance with this invention, forms a circuit, optical element, or magnetic device. Representative examples of functional molecules which are suitable for use in the present invention include carbon or oxide nanotubes, nanowires, functionalized, saturated or unsaturated hydrocarbons, including substituted aromatics or conjugated aromatics, natural or synthetic proteins, natural or synthetic polynucleotides, catenanes, rotaxanes, conductive polymers such as polyaniline, semiconductors, nanoparticles of oxides, sulfides, chalcogenides, or the like.

The method of the invention exploits ferroelectric properties of substrates. The ferroelectric substrate may be inorganic, e.g. a ferroelectric ceramic material, or organic, e.g. a ferroelectric polymer, and may be grown on a semiconductor substrate, such as silicon. A ferroelectric material is one that contains electrical dipoles having a local surface charge associated therewith. The electric polarization of a ferroelectric material can be oriented by application of an external energy field, such as an electric field. Other processes that could be used to pattern the surface charge include exposure to optical illumination or an electron beam through a mask, exposure to interference patterns of two or more optical or electron beams, and application of electric fields from patterned electrodes (for example those produced from microcontact printing). Representative examples of ferroelectric materials include, without limitation, barium titanate, lead titanate, lead zirconate titanate (PZT), triglycine sulfate (TGS), guanidinium aluminum sulfate hexahydrate (GASH), and the like. The ferroelectric material may be in the form of a thin film, a thick polycrystalline film, or a single crystal.

A localized region of positive or negative charge can be established on a ferroelectric substrate, as has been demonstrated using proximity probes, including, for example, commercial Atomic Force Microscopes or Scanning Tunneling Microscopes. For example, a Digital Instruments Dimension 3000 NS-III has been used to make positive and negative domains on PZT. This was achieved by applying a voltage of 10V to the probe tip with the microscope set in contact mode. The size of the switched domain is controlled by the scan size. $W_2C$ coated tips on cantilevers with l=125 $\mu$m and resonant frequency ~350 kHz were used successfully for this purpose. See also, C. Ahn et al. Science, 276: 1100 (1997). The position of the probe tip can be controlled, e.g., by computer, and patterns "written" on the surface of the ferroelectric substrate. Such patterns may include, lines, squares, and other geometrical configurations. Preferably, an array of probe tips will be used to produce the desired pattern, rather than individual tips.

It is now well documented that surface reactions are extremely sensitive to the surface configuration. A difference of a 100 meV of surface potential between positive and negative domains significantly affects surface adsorption. See, for example, V. Henrich and A. Cox, *Surface Science of Oxides*, Cambridge University Press 1994 or D. A. Bonnell, *Progress in Surface Science*, 57: 187–252 (1998). This property is exploited in the practice of the present invention by causing site selective deposition of electrically conductive metal ions to occur at the localized regions of altered polarization, produced as described above.

Photoreduction of the metal ions deposited on the surface of the ferroelectric substrate can be performed according to conventional procedures known in the art. For example, silver may be deposited using a silver nitrate or silver perchlorate solution (typical concentration of 0.00001–0.01 mol/dm$^3$), which is exposed to 200–700 nm light. For any given substrate, the deposition rate and metal structure tend to vary with space charge, the presence of electrodes, and surface orientation. Other electrically conductive metals that may be similarly deposited include gold, indium, palladium, platinum, copper or the like. Various inorganic and organic additives may be added to the solution to optimize reaction yields.

The metalized substrate is contacted with a solution of functional molecules having one or more reactive groups that react with the deposited metal and not with the substrate. It is well documented, for example, that a molecule may be derivatized with a thiol group so that it reacts selectively with gold. The most common examples of such molecules are those of the formula $HS(CH_2)_nX$, wherein X may represent —OH, —COOH or —CH$_3$, and n is an integer from 1 to 20, though other molecules may be used including, for example, conjugated molecules and those containing aromatics and/or hetero-atoms. The configuration of the metalization pattern on the substrate and the chemistry for attaching functional molecules to the deposited metal can be adjusted so that the functional molecule links two metal contacts. The end groups of the functional molecules can also be chosen such that one end attaches to the metal contact and the other to an adjacent molecule. Alternatively the end groups of the functional molecules can be designed for molecular recognition, as for chemical or biochemical sensors.

In practice, a substrate 10 of ferroelectric material, as shown in FIG. 1, having a first polarization distribution is provided which, as noted above, may be a thin film, a thick polycrystalline film or a single crystal. The orientation of the domains in one or more localized regions 12 of a predetermined pattern is altered, or "switched," relative to the first polarization distribution in the ferroelectric substrate 10, as shown in stage 1(a) of FIG. 1.

As previously noted, this switching of polarization distribution can be accomplished by means of an applied electric field generated, for example, by an Atomic Force Microscope or a Scanning Tunneling Microscope 14. The switched regions may occupy an area as small as 75 square nanometers or smaller. After the domains of the localized regions of the ferroelectric substrate 10 have been altered to have a different orientation from that of the first polarization distribution, as described above, the substrate 10 is exposed, e.g. by dipping, to a solution of electrically conductive metal ions 22, as shown in stage 1(b) of FIG. 1. The metal ions 22 are deposited from solution, by adsorption, absorption, chemisorption, and the like, at the switched localized regions 12, due to charge interactions between the metal ions 22 and the switched localized regions 12.

The metal ions 22 from solution are selectively photoreduced over the oppositely charged region by exposure to light of appropriate wave length, as can be seen in stage 1(b). In this way, metal 16 is deposited at the switched localized regions 12, as shown in stage 1(c). In addition metal may be deposited at any pre-existing domains having the same polarization orientation as that of the switched localized regions 12, should such domains exist. The metalized substrate 10 is next rinsed leaving a metal film array in the pre-determined pattern. The metalized substrate 10 is thereafter brought into contact, e.g. by dipping, with a solution containing functional molecules 18, 18' as shown in stage 1(d). The functional molecules 18, 18' have reactive groups that react with the deposited metal 16 and do not react with the substrate 10. The resulting orientation of the bound functional molecules 18, as illustrated in stage 1(e), depends on whether the molecules comprise one or more reactive groups and on the metal pattern selected. For example, the bound functional molecule 18 may comprise a metal-reactive group on each end, such as a thiol, so that the functional molecules 18 bind to two deposited metal regions 16, as shown in step 1(e) of FIG. 1. Lastly, the substrate 10 is rinsed to remove any functional molecules 18' not bound during step 1(d).

The series of steps comprising the method of the invention may be repeated one or more times, if desired. Subsequent iterations may employ different metals 28, different functional molecules 30, 30', different reactive groups on the functional molecules 30, 30', or a combination of such variations to produce a complex circuit, as can be seen in stages 1(f)–1(i) of FIG. 1.

In those embodiments in which an organic ferroelectric film is used as the substrate 10, the film can be burned out in the course of performing the method, so that the metal pattern collapses to an underlying surface, e.g. a conventional semiconductor.

EXAMPLES

Figure 2:
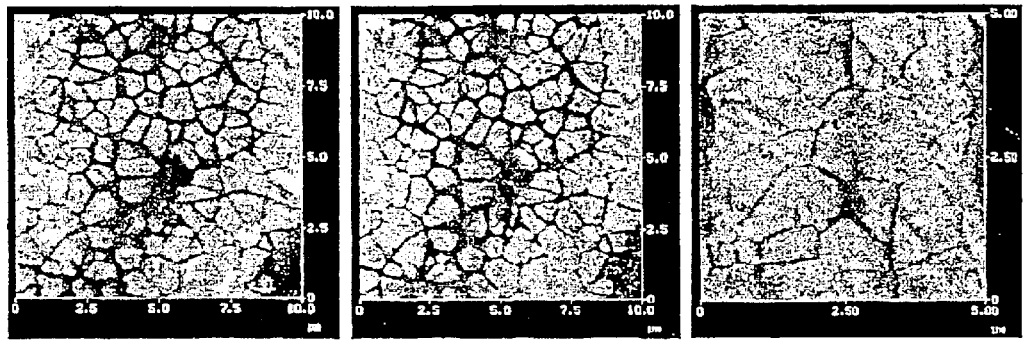
FIGS. 2(a)–2(f) are photomicrographs showing the surface topography and polarization distribution of lead zirconate titanate substrates before and after switching.
Figure 2:
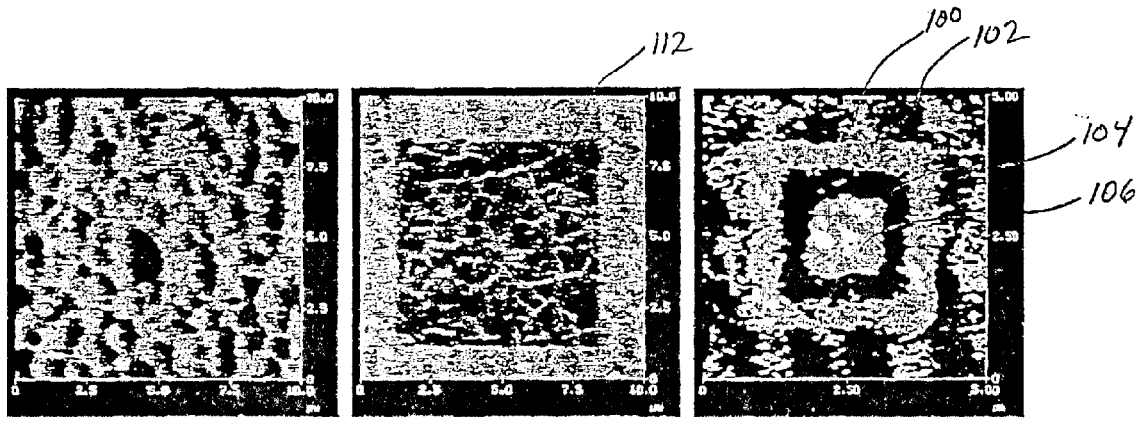

FIG. 2 is an illustrative example of a lead zirconate titanate substrate patterned in accordance with step 1(a) of FIG. 1. Prior to writing the substrate to orient the domains, contact-mode AFM and piezoresponse force microscopy (PFM) measurements were performed using a commercial instrument (Digital Instruments Dimension 3000 NS-III) to characterize the topography, FIG. 2(a), and polarization distribution, FIG. 2(d), of the surface. To perform piezoresponse measurements, the AFM was additionally equipped with a function generator and lock-in amplifier (DS340, SRS 830, Stanford Research Systems). Platinum coated tips (1>>125 $\mu$m, resonant frequency ~350 kHz, SiliconMDT NSCS12 Pt) were used for these measurements. After characterization of the initial state of the substrate surface, selected portions of the surface were addressed to provide regions of switched polarization.

The tip of the AFM was biased –10 Vdc and scanned over a square region of the substrate surface to switch the polarization therein to provide a switched localized region 112, as seen in FIG. 2(e). Comparison of the surface topography before and after switching, FIGS. 2(a) and 2(b), respectively, revealed that the switching did not alter the surface topography. More complicated patterns may also be created by the multiple applications of step 1(a) of FIG. 1, as shown in FIG. 2(f).

The localized region 100 of switched polarization shown in FIG. 2(f) includes three nested squares 102, 104, 106 having sides of differing lengths, each square centered about the same point. The first localized region 100 was formed by switching the polarization of localized region 102 by biasing the tip of the AFM to –10 Vdc and passing it over the area of first localized region 102 to orient the polarization within the outermost square. Subsequently, the tip of the AFM was biased to +10 Vdc and passed over the area of the second localized region 104 to switch the polarization within the second localized region 104. Then, the tip of the AFM was biased to –10 Vdc and passed over the area of the third localized region 106 to switch the polarization within the innermost square. As a result of this processing, a localized region 100 is created having the three nested squares 102, 104, 106 of alternating, switched polarizations.

Figure 3:
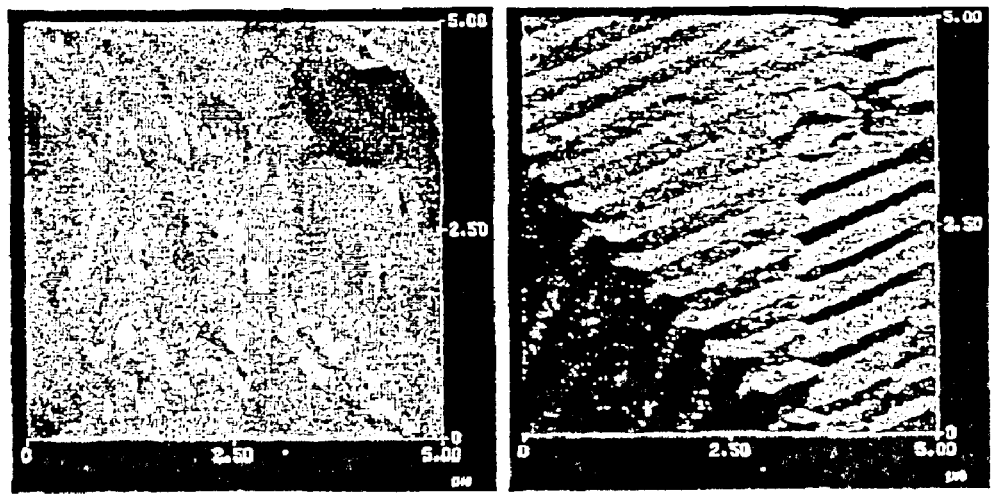
Figure 3:
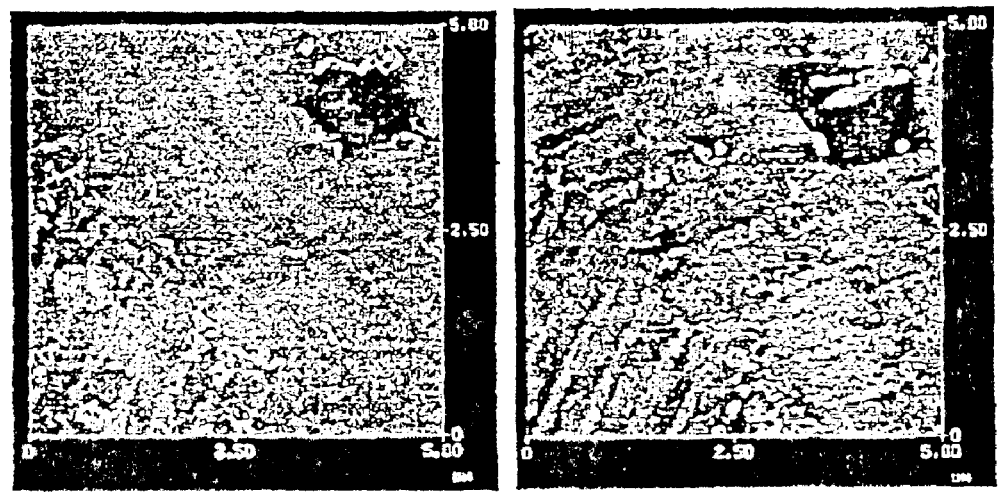
Figure 4:
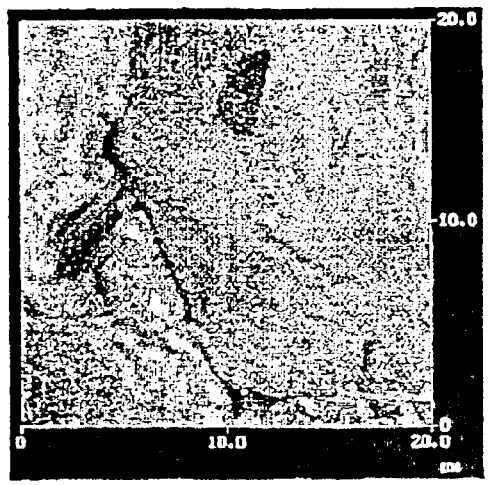
Figure 4:
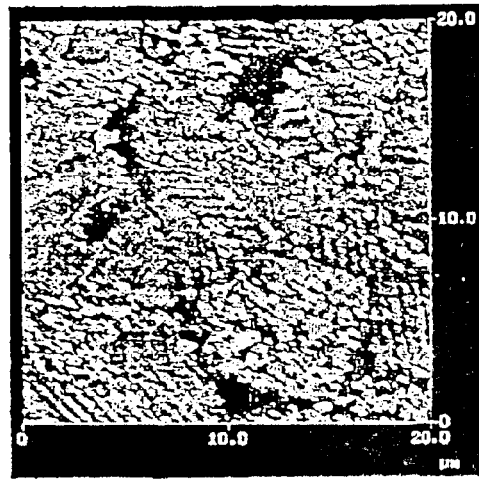
Figure 4:
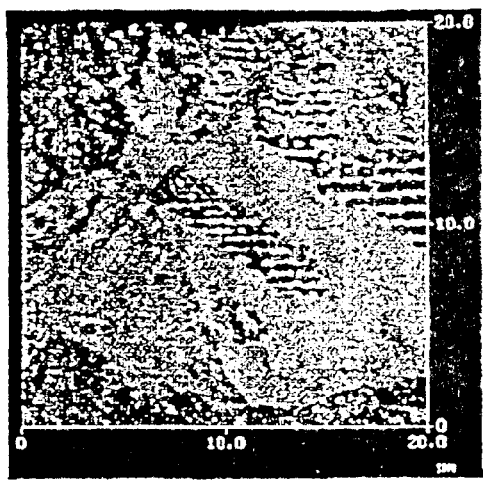
Figure 4:

FIG. 4 is an illustrative example of a substrate provided with deposited metal in accordance with steps 1(a) through 1(c) of FIG. 1, whereas FIG. 3 is an illustrative example of a substrate provided with deposited metal in accordance with steps 1(b) and 1(c) of FIG. 1. As shown in FIGS. 3 and 4, polished and annealed $BaTiO_3$ ceramic samples were imaged using PFM. Biasing was used to perform local polarization switching in the selected regions of the sample of FIG. 4, and PFM was used to confirm the modifications in the domain structure. The sample of FIG. 3 was not switched but used in its unaltered polarization state. The switched sample of FIG. 4 and the unaltered sample of FIG. 3 were each placed in a cation solution and irradiated by UV lamp. Finally, tapping mode AFM was used to image the same region and determine the deposition pattern. Throughout the experiment, large scale topographic features (pores, grain boundaries, etc) were used to ensure that the imaging was performed over the same region. The details of the individual experimental steps are given below.

$BaTiO_3$ samples were prepared by sintering commercial $BaTiO_3$ powder (Aldrich), which was thereafter ball-milled and pressed into pellets. The pellets were annealed for 12 hours at 1400° C., and samples were cut by a diamond saw and exposed surfaces were polished with SiC media down to 1 $\mu$m grit size. Subsequently, samples were polished by alumina down to 50 nm size. The samples thus obtained were then thermally etched at 1200° C. for 12 hours. The etching resulted in the formation of the grooves at the grain boundaries and faceting of the grain themselves, resulting in the clearly seen topographic contrast of the surface, as seen in FIGS. 3(a) and 4(a). At the same time, the thermal etching relieved surface damage associated with polishing processes. This preparation yielded a substrate material having a distribution of polarization domains.

Contact-mode AFM and PFM measurements were performed using the same equipment described above with respect to the measurement of the samples of FIG. 2. With regard to the sample of FIG. 3, after characterization of the initial state of the substrate surface, the sample was not switched, and metal was deposited onto the substrate in accordance with steps 1(b) and 1(c) of FIG. 1.

To perform the photo-deposition of step 1(b) of FIG. 1, the $BaTiO_3$ sample shown in FIG. 3(b) was placed in a 0.01 M $AgNO_3$ solution and irradiated by a Xe—UV lamp for 10 s at 100W. Afterwards, the sample was washed with deionized water and dried by air flow, to yield a surface having elemental silver deposited thereon in locations corresponding to the polarization pattern of FIG. 3(b), as shown by the bright lines in FIG. 3(c). The ability to deposit palladium on the sample was demonstrated by removing the deposited silver from the sample of FIG. 3(c) and subsequently processing the sample in a 0.01M $PdCl_2$ solution. Deposition conditions were specific for the individual cations, e.g. Pd required a longer exposure time (~30 min from 0.01M $PdCl_2$ solution) than Ag. After exposing the sample with a Xe—UV lamp for 30 minutes at 100W and washing, elemental palladium was deposited at localized regions corresponding to the polarization pattern of FIG. 3(b), as shown by the bright lines in FIG. 3(d).

Regarding the sample of FIG. 4, after characterization of the initial state of the substrate surface, selected portions of the surface were addressed to provide regions of switched polarization, as shown in FIGS. 4(c). For the step of polarization switching in the $BaTiO_3$ ceramic samples, step 1(a) of FIG. 1, the atomic force microscope was equipped with a PS310 high voltage power supply (Stanford Research Systems), because polarization switching in $BaTiO_3$ ceramics requires relatively high voltages (100 Vdc) and the internal microscope channels limit the writing voltage to 12 Vdc. To avoid capacitive cross-talk in the scanning probe microscope (SPM) head, the electrical connections between the microscope and the tip were severed; instead a wire was connected from the function generator to the tip using a custom-built sample holder. This set-up also allowed application of the high voltages (up to 100 Vdc) necessary to perform polarization switching in the $BaTiO_3$ ceramic substrate.

To perform local polarization switching, the ac biasing of the tip was discontinued, and dc voltage was applied to the tip. After scanning a selected region, the tip was ac biased and scanned over a larger region, thus allowing the switched domain to be read. The modulation amplitude in the PFM imaging was 6 Vpp. The use of larger modulation amplitudes resulted in polarization reversal in the switched regions. The sample of FIGS. 4(b) and 4(d) was written with a square pattern 130.

The photo-deposition of step 1(b) of FIG. 1, the $BaTiO_3$ was performed by placing the sample in a 0.01 M $AgNO_3$ solution and irradiating the sample with a Xe—UV lamp for 10 s at 100W. Afterwards, the deposition samples were washed with deionized water and dried by air flow. FIG. 4(b) shows elemental silver (the bright regions) deposited on the surface of the substrate in the regions corresponding to the polarization-switched regions, such as switched region 130 for FIG. 4(b). In addition, as seen in FIG. 4(b), silver is deposited outside the switched region 130, since the substrate contained a random distribution of polarization domains outside of the switched region 130. However, the highest density of silver is contained with in the switched region 130, as shown in FIG. 4(b).

To create a nanoscale molecular device from the metallized substrates of the types depicted in FIG. 4, a functional molecule tailored to the functionality required in the final device may be attached to one or more of the deposited metal regions of the substrate. For example, a device having diode electrical properties may be created by attaching a monolayer of 2'-amino-4-ethynylphenyl-4-ethynylphenyl-5'-nitro-1-benzenethiol between two deposited metal regions of the substrate. Such a molecule is demonstrated to have diode electrical properties, as disclosed in J. Chen, et al., *Science*, 286: 1550–51 (1999).

As will be appreciated by those experienced in the field of this invention, the method described and exemplified above exploits the advantages of chemical self-organization, while overcoming its primary disadvantage, namely, the inability to selectively position individual functional molecules. Moreover, the materials employed have been accepted in commercial, semi-conductor fabrication processes for other applications. Thus, material compatibility should not pose an impediment to implementation of this nano technology.

Nanoscale devices fabricated as described herein may be used in computers and all electronic systems that utilize computer processors, including consumer electronics, wireless systems and medical diagnostics, to name a few. They may also be used as active components of optical devices, chemical and biochemical sensors. In these cases the functional molecule would be chosen to be optically active for the former and have chemical specificity or molecular recognition properties for the latter. In all cases the devices might be stand alone or integrated into larger systems, such as 'system on a chip' designs.

While certain embodiments of the present invention have been described and/or exemplified above, various other embodiments will be apparent to those skilled in the art from the foregoing disclosure. For example, functional molecules may be reacted directly onto the ferroelectric substrate, in the event the metal contact is not required for a particular nanoscale device. The present invention is, therefore, not limited to the particular embodiments described and/or exemplified above but is capable of considerable variation and modification without departure from the scope of the appended claims.

What is claimed is:

1. A method of processing a substrate for use in a nanoscale molecular device, comprising the steps of:
    a. providing a substrate of ferroelectric material having a first polarization distribution;
    b. establishing on said substrate at least one localized region having a second polarization distribution oriented differently from said first polarization distribution by the influence of an energy field applied to said at least one localized region;
    c. exposing said substrate to ions of an electrically conductive metal, said metal ions being deposited selectively at said at least one localized region due to interaction between said metal ions and said at least one localized region; and
    d. converting said deposited metal ions to elemental metal at said at least one localized region.

2. A method as claimed in claim 1, wherein said energy field comprises one or more of an electric field, an electron beam, electromagnetic radiation, optical radiation, and magnetic energy.

3. A method as claimed in claim 1, wherein said ferroelectric material comprises an organic ferroelectric film, and the method comprises the step of burning out said organic ferroelectric film, so that the elemental metal collapses to an underlying surface.

4. A method as claimed in claim 1, wherein a plurality of distinct, localized regions of polarization distributions oriented differently from said first polarization distribution are established in a pre-determined pattern on said substrate.

5. A method as claimed in claim 4, wherein a first of said distinct regions has a different elemental metal deposited thereon than a second of said distinct regions.

6. A method as claimed in claim 4, wherein a first of said distinct regions has a different functional molecule bound thereto than a second of said distinct regions.

7. A method as claimed in claim 1, comprising the further step of chemically binding at least one functional molecule to said elemental metal.

8. A method as claimed in claim 7, wherein a plurality of distinct, localized regions of polarization distributions oriented differently from said first polarization distribution are established in a pre-determined pattern on said substrate and wherein said at least one functional molecule has a first end and a second end, and the step of binding said at least one functional molecule comprises binding said first end of said functional molecule to a first of said distinct regions and binding said second end of said functional molecule to a second of said distinct regions.

9. A method as claimed in claim 7, comprising the further step of removing any unbound functional molecule from said substrate, to yield said nanoscale molecular device.

10. A method as claimed in claim 1, wherein a plurality of distinct, localized regions of polarization distributions oriented differently from said first polarization distribution are established in a pre-determined pattern on said substrate, and wherein a first of said distinct regions has a first functional molecule bound thereto and a second of said distinct regions has a second functional molecule bound thereto, said first and second functional molecules being attached to one another.

11. A method of producing a nanoscale molecular device, comprising the steps of:
  a. providing a substrate of ferroelectric material having an ordered polarization distribution;
  b. establishing on said substrate at least one localized region at which said polarization is switched relative to said pre-existing orientation, under the influence of an electric field applied to said at least one localized region;
  c. exposing said substrate to ions of an electrically conductive metal, said metal ions being deposited selectively at said at least one localized region of switched polarization due to charge interaction between said metal ions and said at least one localized region of switched polarization;
  d. converting said deposited metal ions to elemental metal at said at least one localized region of switched polarization;
  e. chemically binding at least one functional molecule to said elemental metal; and
  f. removing any unbound functional molecule from said substrate, to yield said nanoscale molecular device.

12. A method as claimed in claim 11, wherein said electric field applied to establish the at least one localized region of switched polarization is generated by a proximal probe device.

13. A method as claimed in claim 12, wherein said proximal probe device is an atomic force microscope or a scanning tunneling microscope.

14. A method as claimed in claim 11, wherein a plurality of distinct, localized regions of switched polarization are established in a pre-determined pattern on said substrate.

15. A method as claimed in claim 14, wherein a first of said distinct regions has a different elemental metal deposited thereon than a second of said distinct regions.

16. A method as claimed in claim 14, wherein a first of said distinct regions has a different functional molecule bound thereto than a second of said distinct regions.

17. A method as claimed in claim 14, wherein said functional molecule has a first end and a second end, and the step of binding said at least one functional molecule comprises binding the first end of said functional molecule to a first of said distinct regions and binding the second end of said functional molecule to a second of said distinct regions.

18. A method as claimed in claim 14, wherein a first of said distinct regions has a first functional molecule bound thereto and a second of said distinct regions has a second functional molecule bound thereto, said first and second functional molecules being attached to one another.

19. A method as claimed in claim 11, wherein said ferroelectric material comprises an organic ferroelectric film, and the method comprises the step of burning out said organic ferroelectric film, so that the elemental metal collapses to an underlying surface.

20. A method of processing a substrate for use in a nanoscale molecular device, comprising the steps of:
  a. providing a substrate of ferroelectric material having a first polarization distribution;
  b. establishing on said substrate at least one localized region having a second polarization distribution oriented differently from said first polarization distribution by the influence of an electric field applied to said at least one localized region;
  c. exposing said substrate to ions of an electrically conductive metal, said metal ions being deposited selectively at said at least one localized region due to charge interaction between said metal ions and said at least one localized region; and
  d. converting said deposited metal ions to elemental metal at said at least one localized region of oriented polarization.

21. A method as claimed in claim 20, wherein the step of providing a substrate comprises providing a substrate having a substantially random polarization distribution.

22. A method as claimed in claim 20, wherein the step of providing a substrate comprises providing a substrate having an ordered polarization distribution.

23. A method as claimed in claim 20, wherein said electric field applied to establish said at least one localized region is generated by a proximal probe device.

24. A method as claimed in claim 23, wherein said proximal probe device is an atomic force microscope or a scanning tunneling microscope.

25. A method as claimed in claim 20, wherein a plurality of distinct, localized regions of polarization distributions oriented differently from said first polarization distribution are established in a pre-determined pattern on said substrate.

26. A method as claimed in claim 25, wherein a first of said distinct regions has a different elemental metal deposited thereon than a second of said distinct regions.

27. A method as claimed in claim 25, wherein a first of said distinct regions has a different functional molecule bound thereto than a second of said distinct regions.

28. A method as claimed in claim 20, comprising the further step of chemically binding at least one functional molecule to said elemental metal.

29. A method as claimed in claim 28, wherein a plurality of distinct, localized regions of polarization distributions oriented differently from said first polarization distribution are established in a pre-determined pattern on said substrate and wherein said at least one functional molecule has a first end and a second end, and wherein the step of binding said at least one functional molecule comprises binding the first end of said functional molecule to a first of said distinct regions and binding the second end of said functional molecule to a second of said distinct regions.

30. A method as claimed in claim 28, comprising the further step of removing any unbound functional molecule from said substrate, to yield said nanoscale molecular device.

31. A method as claimed in claim 28, wherein a plurality of distinct, localized regions of polarization distributions oriented differently from said first polarization distribution are established in a pre-determined pattern on said substrate and wherein a first of said distinct regions has a first functional molecule bound thereto and a second of said distinct regions has a second functional molecule bound thereto, said first and second functional molecules being attached to one another.

32. A method as claimed in claim 20, wherein said ferroelectric material comprises an organic ferroelectric film, and the method comprises the step of burning out said organic ferroelectric film, so that the elemental metal collapses to an underlying surface.

33. A nanoscale molecular device, comprising:
   a substrate of ferroelectric material having at least one localized region at which the polarization is oriented to a pre-determined orientation, and at least one functional molecule bound to said at least one localized region.

34. A device as claimed in claim 33, wherein said at least one localized region comprises at least one metal and wherein said at least one functional molecule is bound to said at least one metal.

35. A device as claimed in claim 33 or claim 34, further comprising a semiconductor wafer, wherein said substrate of ferroelectric material is disposed on said semiconductor wafer.

36. A device as claimed in claim 33 or claim 34, wherein said functional molecules are selected from the group consisting of nanowires, carbon nanotubes, and oxide nanotubes.

37. A device as claimed in claim 33 or claim 34, wherein said functional molecules are selected from the group consisting of functionalized saturated hydrocarbons, functionalized unsaturated hydrocarbons, proteins, polynucleotides, conjugated hydrocarbons, and rotaxanes.

38. A device as claimed in claim 33 or claim 34, wherein said at least one localized region comprises a plurality of distinct, localized regions of oriented polarization disposed in a pre-determined pattern on said substrate.

39. A device as claimed in claim 38, wherein a first of said distinct regions has a different elemental metal deposited thereon than a second of said distinct regions.

40. A device as claimed in claim 38, wherein a first of said distinct regions has a different functional molecule bound thereto than a second of said distinct regions.

41. A device as claimed in claim 38, wherein said functional molecule is bound to a first of said distinct regions and to a second of said distinct regions.

42. A device as claimed in claim 38, wherein a first of said distinct regions has a first functional molecule bound thereto and a second of said distinct regions has a second functional molecule bound thereto, said first and second functional molecules being attached to one another.

43. A method according to any one of claims 1, 11, and 20 wherein the step of establishing said at least one localized region comprises applying said field using a patterned electrode.

44. A method of processing a substrate for use in a nanoscale molecular device, comprising the steps of:
   a. providing a substrate of ferroelectric material having a first polarization distribution;
   b. establishing on said substrate at least one localized region having a second polarization distribution oriented differently from said first polarization distribution by the influence of an energy field applied to said at least one localized region; and
   c. exposing said substrate to a functional molecule and binding said functional molecule onto said at least one localized region of the ferroelectric material due to direct reaction between said functional molecule and said at least one localized region.

45. A method as claimed in claim 44, wherein said energy field comprises one or more of an electric field, an electron beam, electromagnetic radiation, optical radiation, and magnetic energy.

46. A method as claimed in claim 44, wherein a plurality of distinct, localized regions of polarization distributions oriented differently from said first polarization distribution are established in a pre-determined pattern on said substrate.

47. A method as claimed in claim 46, wherein a first of said distinct regions has a different functional molecule bound thereto than a second of said distinct regions.

48. A method as claimed in claim 46, wherein said functional molecule has a first end and a second end, and said reaction between said functional molecule and said at least one localized region comprises binding said first end of said functional molecule to a first of said distinct localized regions and binding said second end of said functional molecule to a second of said distinct localized regions.

49. A method as claimed in claim 48, comprising the further step of removing any unbound functional molecule from said substrate, to yield said nanoscale molecular device.

50. A method as claimed in claim 46, wherein a first of said distinct regions has a first functional molecule bound thereto and a second of said distinct regions has a second functional molecule bound thereto, said first and second functional molecules being attached to one another.

51. A method of producing a nanoscale molecular device, comprising the steps of:
   d. providing a substrate of ferroelectric material having a polarization distribution ordered in a first orientation;
   e. establishing on said substrate at least one localized region at which said polarization is switched relative to said first orientation, under the influence of an electric field applied to said at least one localized region;
   f. chemically binding at least one functional molecule directly to said at least one localized region; and
   g. removing any unbound functional molecule from said substrate, to yield said nanoscale molecular device.

52. A method as claimed in claim 51, wherein said electric field applied to establish the at least one localized region of switched polarization is generated by a proximal probe device.

53. A method as claimed in claim 52, wherein said proximal probe device is an atomic force microscope or a scanning tunneling microscope.

54. A method as claimed in claim 51, wherein a plurality of distinct, localized regions of switched polarization are established in a pre-determined pattern on said substrate.

55. A method as claimed in claim 54, wherein a first of said distinct regions has a different functional molecule deposited thereon than a second of said distinct regions.

56. A method as claimed in claim 54, wherein said functional molecule has a first end and a second end, and the step of binding said at least one functional molecule comprises binding the first end of said functional molecule to a first of said distinct regions and binding the second end of said functional molecule to a second of said distinct regions.

57. A method as claimed in claim 54, wherein a first of said distinct regions has a first functional molecule bound thereto and a second of said distinct regions has a second functional molecule bound thereto, said first and second functional molecules being attached to one another.

* * * * *